United States Patent

Tsai

[11] Patent Number: 5,843,806
[45] Date of Patent: Dec. 1, 1998

[54] METHODS FOR PACKAGING TAB-BGA INTEGRATED CIRCUITS

[75] Inventor: Wei-Jen Tsai, Taoyuan Hsien, Taiwan

[73] Assignee: Compeq Manufacturing Company Limited, Taiwan

[21] Appl. No.: 977,316

[22] Filed: Nov. 24, 1997

[51] Int. Cl.⁶ .................................................. H01L 21/44
[52] U.S. Cl. .......................................... 438/107; 438/109
[58] Field of Search .................................... 438/107, 108, 438/109, 679, 687

[56] References Cited

U.S. PATENT DOCUMENTS

| | | | |
|---|---|---|---|
| 5,262,351 | 11/1993 | Bureau et al. | 438/107 |
| 5,270,261 | 12/1993 | Bertin et al. | 438/109 |
| 5,426,072 | 6/1995 | Finnila | 438/107 |
| 5,527,741 | 6/1996 | Cole et al. | 438/107 |
| 5,548,099 | 8/1996 | Cole, Jr. et al. | 438/107 |

*Primary Examiner*—Kevin Picardat
*Attorney, Agent, or Firm*—Holland & Hart LLP

[57] ABSTRACT

Methods for packaging TAB-BGA integrated circuits are disclosed, which mainly include steps of providing a double-sided polyimide; forming first dry film layers; sequentially performing a multi-layer electroplating operation of electro-coppering, electronickelling, gold plating and electronickelling again (or electronickelling and gold plating, or electro-coppering and electronickelling); removing the first dry film layers; serving a lower second dry film layer as a mask for etching a bottom thin copper layer to define a plurality of predetermined openings; serving the bottom thin copper layer as a mask for applying a laser etching operation to the polyimide substrate to define holes without totally penetrating the polyimide substrate; applying an electrolytic plating operation to the holes for forming protruding contacts; etching the exposed top thin copper layer and/or removing a nickel-electroplated layer; and respectively defining a chip installation hole and a plurality of through holes by performing a laser drilling operation, and a chip is attached to the two electroplated multi-layer (or double-layer) protrusions beside the chip installation hole by using a single point bond method, in which reducing the external contacts and minimizing the package dimension are achieved.

12 Claims, 5 Drawing Sheets

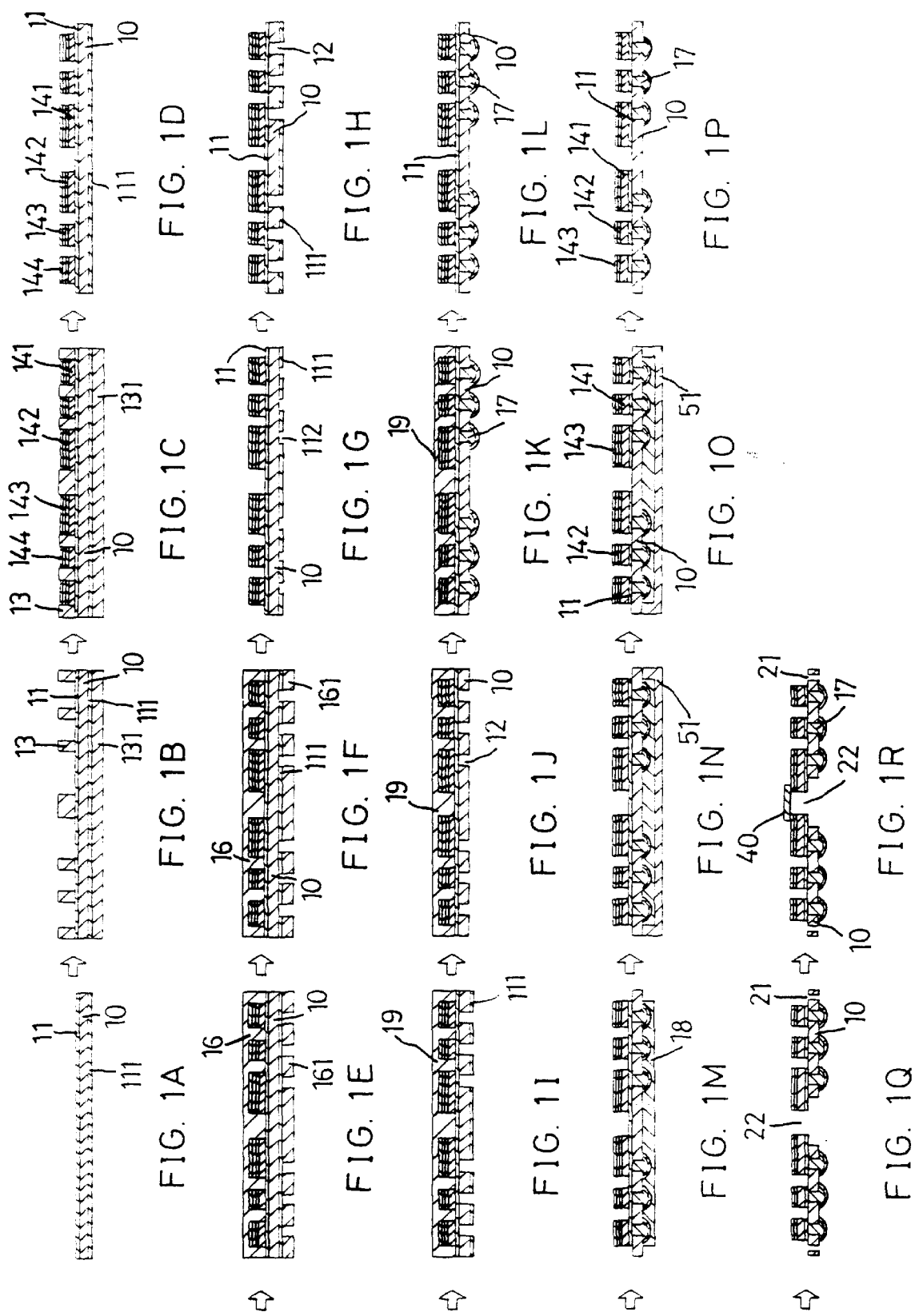

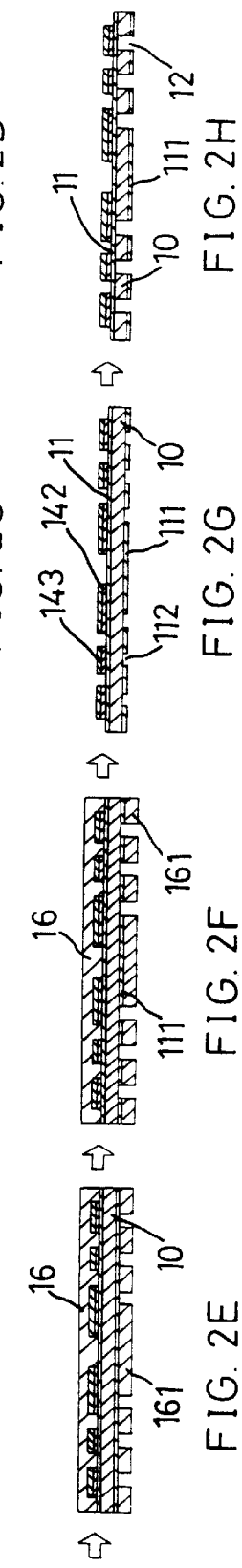

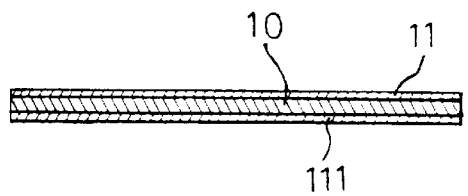
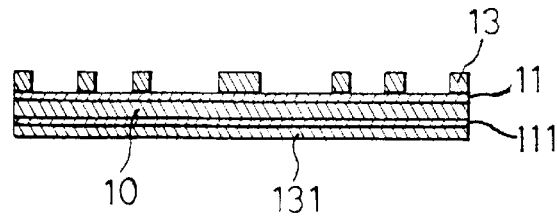
FIG. 3A  FIG. 3B
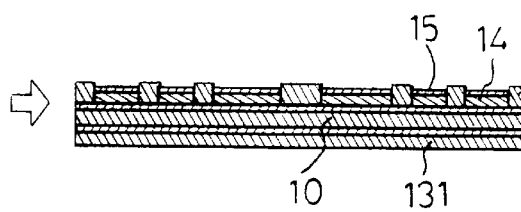
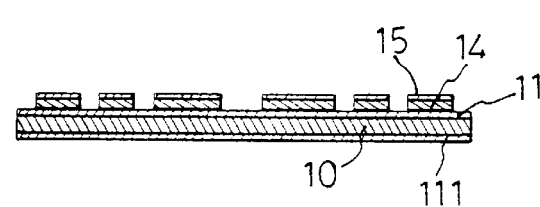
FIG. 3C  FIG. 3D
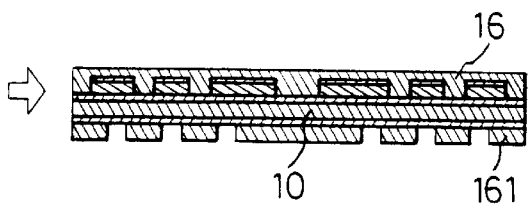
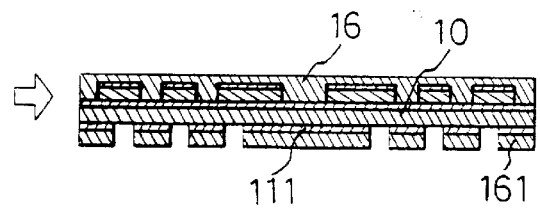
FIG. 3E  FIG. 3F
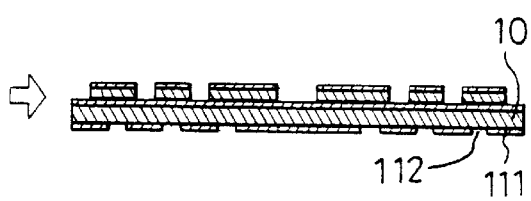
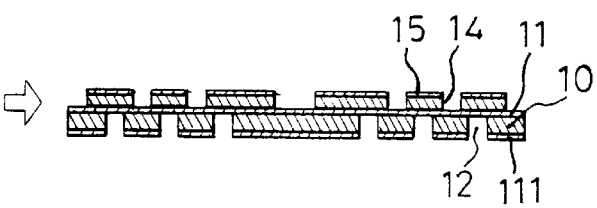
FIG. 3G  FIG. 3H
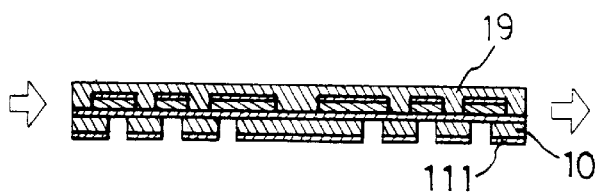
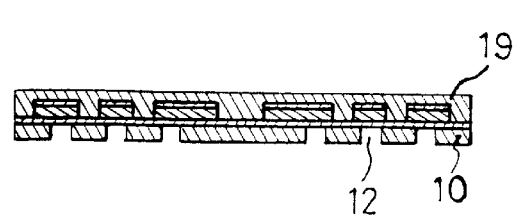
FIG. 3I  FIG. 3J

METHODS FOR PACKAGING TAB-BGA INTEGRATED CIRCUITS

BACKGROUND OF THE INVENTION

1. The Field of the Invention

The present invention relates to methods for packaging TAB-BGA integrated circuits, in which a low cost substrate is applied, an accurate positioning for each external contact is obtained, a much finer external contact is formed and an adequate reduction of a package dimension is achieved.

2. Description of the Related Art

In view of the method for packaging a TAB-BGA integrated circuit presently, a typical manufacturing process of 3M Company™ is shown in FIGS. 4A through 4I. First, as shown in FIG. 4A, a polyimide with a layer of thin copper is provided by sputtering a thin layer of copper 91 on a polyimide 90 by using a sputtering deposition method such as a Physical Vapor Deposition (PVD) or a Chemical Vapor Deposition (CVD). Next, as shown in FIG. 4B, a thin layer of copper 92 is electroplated on the thin copper-sputtered layer 91 by using an electroplating method. Then, as shown in FIG. 4C, a plurality of dry film layers 93 is each made of an etch resistant material and respectively laminated on an upper surface and a lower surface of a laminate, and the upper and lower dry film layers 93 is each then exposed/developed to respectively form a respective pattern with a plurality of predetermined openings. Thereafter, as shown in FIG. 4D, a thick layer of electroplated copper 94 is formed between the openings on the upper dry film layer 93. Subsequently, as shown in FIG. 4E, a plurality of cone-shaped openings 97 provided for receiving solder balls are defined after the polyimide 90 has been etched while the lower dry film layer 93 serves as a mask. Then, in FIG. 4F, a double-layer of electronickelling and chromium-plating operation is performed by electrolysis to respectively form a nickel/chromium electroplated layer on the thick copper-electroplated layer 94 and the cone-shaped openings 97. And then, as shown in FIG. 4G, the upper and lower dry film layers 93 are etched to remove. Thereafter, as shown in FIG. 4H, the exposed thin copper-electroplated layer 92 and the thin copper-sputtered layer 91 are sequentially removed. Finally, as shown in FIG. 4I, solder balls 98 are attached to the cone-shaped openings 97 to form external contacts, and a chip 40 is attached to one of nickel/chromium electroplated layer 96 while metal wires 41 are respectively connected between the pins of the chip 40 and one end of the nickel/chromium electroplated layer 96 and corresponding positions.

However, the conventional method for packaging a TAB-BGA integrated circuit described above has disadvantages as follows: (1) Although a layer of copper formed on a polyimide by using a sputtering deposition method can be both thin and uniform, such a manufacturing process is rather expensive and the cost is even higher when applying such a sputtering operation on such a large area. (2) As described above, the solder balls are attached to the cone-shaped openings for external connections. Because there is a certain limitation to the size of the solder balls, a dimensional tolerance for allowance errors exists in designing the corresponding cone-shaped openings provided for the solder ball attachment. Therefore, the external contacts can not be minimized since the dimension of the external contacts and the spacing between them can not be significantly reduced. Further, the way of attaching the solder balls is to roll the solder balls on a printed circuit board to fall into the cone-shaped openings and then the solder balls are combined with the metal in the openings through high temperature, whereby a phenomenon of insufficient positioning accuracy occurs. That is, the alignment of each solder ball can not be ensured and thus, the requirements of a higher precision and a finer contact can not be achieved. (3) Because a chromium layer provides a contact with a chip, the way of the connection between them must be a jumper wire connection by using a chromium wire bonding method. Such a packaging method for connecting a chip through jumper wires causes the dimension of the entire packaging circuit board to become larger since the area that the jumper wires occupies is large, and thus, a requirement of high density can not be achieved. Therefore, some problems still remain unsolved.

SUMMARY OF THE INVENTION

The present invention is directed to methods for packaging TAB-BGA integrated circuits.

An objective of the present invention is to provide methods for packaging TAB-BGA integrated circuits, in which a low cost substrate is applied, a precise positioning for each external contact is obtained, a much finer external contact is formed and an adequate reduction of a package dimension is achieved.

In accordance with one aspect of the invention, there is provided a method for packaging a TAB-BGA integrated circuit, mainly comprising: a step of directly providing a polyimide with a pre-laminated thin copper layer on each of the two sides as a substrate; a step of sequentially applying a multi-layer electroplating operation of electro-coppering, electronickelling, gold plating and electronickelling again to form a plurality of electroplated layers on an upper surface of the polyimide substrate; a step of serving a bottom thin copper layer as a mask to define holes without being entirely penetrated in the polyimide by using a laser etching method; a step of applying an electrolytic plating operation to each hole for forming protruding electrolytic contacts; a step of etching the exposed top thin copper layer and removing a nickel-electroplated layer; and a step of respectively defining a chip installation hole and a plurality of through holes by using a laser drilling method, thereby achieving an improved method for packaging a TAB-BGA integrated circuit. Since the double-sided polyimide serves as a fabricating substrate, not only is the cost of a substrate material lowered, but also insufficient positioning precision due to the solder ball attachment can be prevented. Further, much finer contacts and an effect of minimizing the spacing between the contacts are achieved, together with the attachment of the chip only requiring a single point bond operation to complete.

In accordance with another aspect of the invention, there is provided a method for packaging a TAB-BGA integrated circuit, in which a step of sequentially performing a multi-layer electroplating operation to form electroplated layers on an upper surface of the polyimide substrate is replaced by merely performing a double-layer electroplating operation of electronickelling and gold plating so as to omit a subsequent step of removing a nickel-electroplated layer.

In accordance with still another aspect of the invention, there is provided a method for packaging a TAB-BGA integrated circuit, in which a step of sequentially performing a multi-layer electroplating operation to form electroplated layers on an upper surface of the polyimide substrate is replaced by merely performing a double-layer electroplating operation of electro-coppering and electronickelling, and then only a plurality of gold plated protruding contacts are formed by applying a gold plating operation on the predetermined positions of a nickel-electroplated layer after removing a dry film layer, thereby providing solder contacts for a chip.

BRIEF DESCRIPTION OF THE DRAWINGS

The above objective, other features and advantages of the present invention will become more apparent by describing in detail the preferred embodiments thereof with reference to the attached drawings, in which:

FIGS. 1A through 1R are cross-sectional views showing a manufacturing process of a first preferred embodiment of the present invention;

FIGS. 2A through 2R are cross-sectional views showing a manufacturing process of a second preferred embodiment of the present invention;

DETAILED DESCRIPTION OF THE PREFERRED EMBODIMENTS

Figures 3K, 3L:
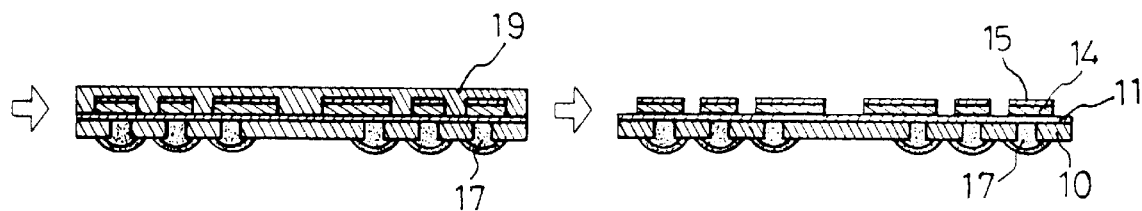
FIGS. 3A through 3S are cross-sectional views showing a manufacturing process of a third preferred embodiment of the present invention.

The present invention provides three different kinds of preferred embodiments which vary slightly in their manufacturing processes merely due to various materials used for respective electroplated layers in each process and are sequentially described in detail as follows.

The first method for packaging a tape automated bonding-ball grid array (which is referred to as TAB-BGA throughout the context) integrated circuit is explained through a first embodiment with reference to FIGS. 1A through 1R. As shown in FIG. 1A, a polyimide 10 on which an upper surface and a lower surface each has already been laminated a respective thin layer of copper 11, 111 is provided as a substrate in the present invention without requiring an additional step of sputtering a layer of copper on the polyimide substrate 10 as must be performed first in a conventional manufacturing process, thereby avoiding the complexity in processing and expensive in material cost due to a requirement of sputtering another layer of copper on the thin copper layer. In FIG. 1B, a plurality of layers of first dry films 13, 131 (which are made of etch resistant material) is each respectively laminated on a top surface and a bottom surface of the polyimide substrate and the top portion is then exposed/developed to define a plurality of predetermined openings therein. As shown in FIG. 1C, a plurality of operations of electro-coppering, a first electronickelling, gold plating and a second electronickelling are sequentially applied to form a multi-layer electroplated layer including a copper-electroplated layer 141, a first nickel-electroplated layer 142, a gold plated layer 143 and a second nickel-electroplated layer 144 from bottom to top inside the predetermined openings. Then, as shown in FIG. 1D, a plurality of protrusions which comprise electroplated multi-layers are formed after the first dry film layers 13, 131 are etched to remove. Thereafter, as shown in FIG. 1E, a plurality of layers of second dry films 16, 161 is each respectively laminated on an upper surface and a lower surface of a laminate and the lower portion is then exposed/developed to define a plurality of predetermined openings therein. Subsequently, as shown in FIG. 1F, the bottom thin copper layer 111 is removed and in FIG. 1G, a pattern of predetermined openings 112 is formed on the bottom thin copper layer 111 after the second dry film layers 16, 161 are removed. Next, as shown in Fig. 1H, serving the bottom thin copper layer 111 with the above pattern as a mask, the bottom of the polyimide 10 is etched by way of a laser etching method, and through controlling the laser energy, the polyimide 10 is etched to define a plurality of holes 12 which do not totally penetrate the polyimide and provides contacts extending downwardly for subsequently electrolytic plating. As shown in FIG. 1I, a layer of a third dry film 19 is laminated on the upper surface of the laminate to protect the pattern previously formed. Thereafter, the bottom thin copper layer 111 is removed as shown in FIG. 1J. Subsequently, in FIG. 1K, the plurality of holes 12 in the polyimide substrate 10 has each applied thereto an electronickelling or electro-coppering operation by electrolysis to form an external contact on a packaged circuit board. The external contact is substantially an electrolytic contact 17 formed by filling the hole 12 with an electrolyte of nickel or copper and a distal end thereof protrudes from the polyimide substrate 10. Then, referring to FIG. 1L, the third dry film layer 19 is removed. Figures 1M and 1N show a layer of protecting film 18 and a layer of a fourth dry film 51 are sequentially formed on the lower surface of the laminate. Referring to FIG. 1O, the second nickel-electroplated layer 144 on the top of the multi-layer electroplated layer and the upper thin copper layer 11 exposed between the electroplated multi-layer protrusions are removed to expose the gold plated layer 143. As shown in FIG. 1P, the protecting film layer 18 and the fourth dry film layer 51 are removed. Finally, as shown in FIG. 1Q, a chip installation hole 22 and a plurality of through holes 21 are respectively defined in a central position and other positions in the outer side of the polyimide substrate 10 by applying a laser drilling operation thereto and after which, a fabricating process for packaging a printed circuit board is carried out. As to the method for installing a chip, as shown in FIG. 1R, a chip 40 is attached to the two protrusions between which the chip installation hole 22 is defined, by directly applying a single point bond operation thereto since on tops of the two protrusions are the gold plated layers 143.

The second method for packaging a TAB-BGA integrated circuit is explained through a second embodiment with reference to FIGS. 2A through 2R. The fabricating steps between the first and the second embodiments are very similar and the only difference is that the multi-layer electroplated layer merely includes a nickel-electroplated layer 142 and a gold plated layer 143, as shown in FIG. 2C, instead of four electroplated layers shown in FIG. 1C. Therefore, as shown in FIG. 2O, the upper thin copper layer 11 exposed between the protrusions is the only one that needs to be removed. Both the first and the second methods for packaging the TAB-BGA integrated circuit have the same result.

Figures 3M, 3N:
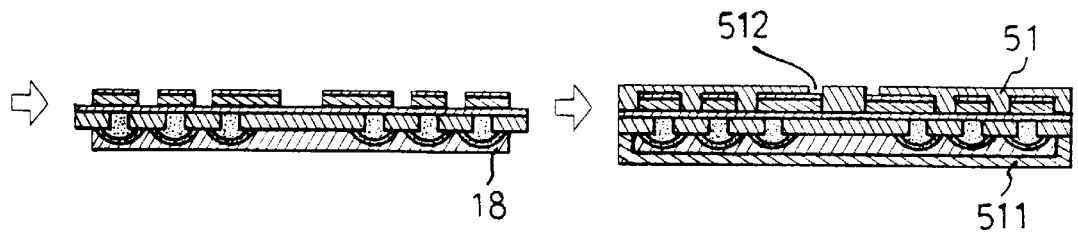
Figures 3O, 3P:
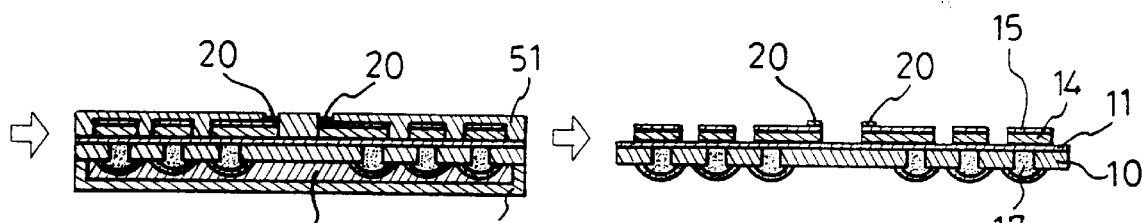
Figures 3Q, 3R:
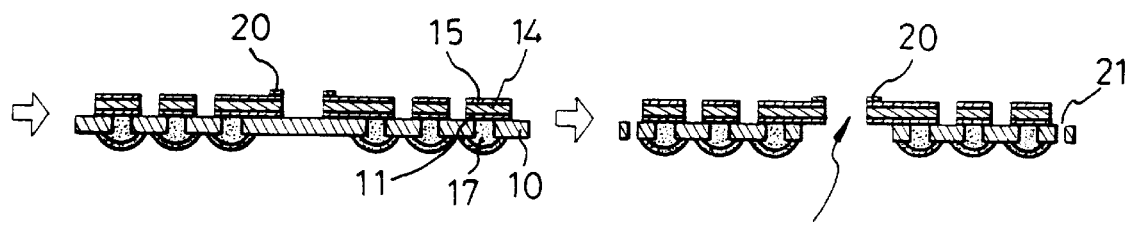
Figure 3S:
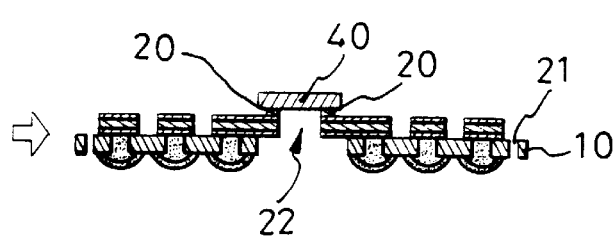
Figure 4A:
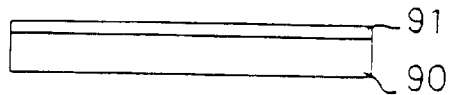
FIGS. 4A through 4I are cross-sectional views showing a manufacturing process for packaging a conventional TAB-BGA integrated circuit.
Figure 4B:
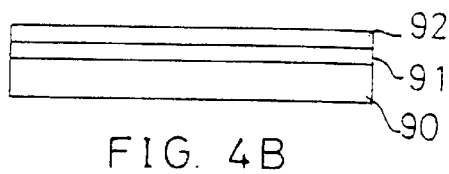
Figure 4C:
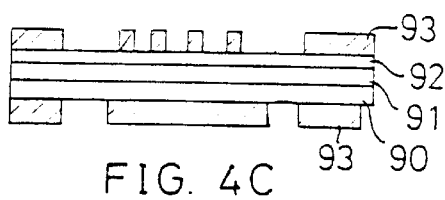
Figure 4D:
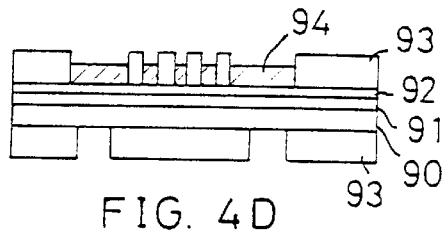
Figure 4E:
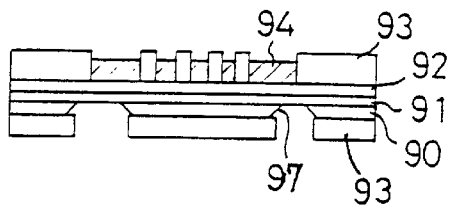
Figure 4F:
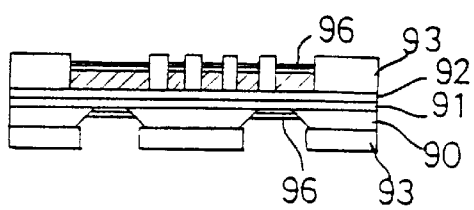
Figure 4G:
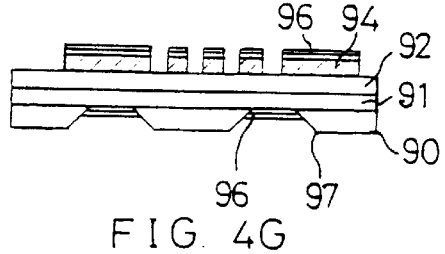
Figure 4H:
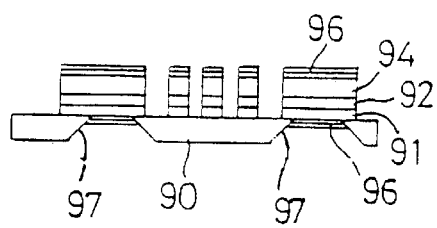
Figure 4I:
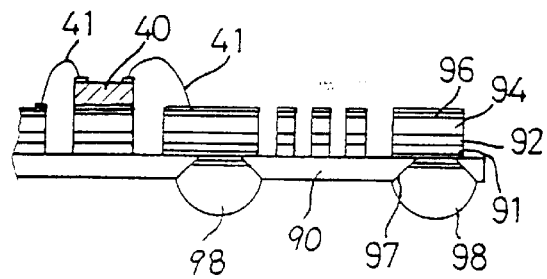

The third method for packaging the TAB-BGA integrated circuit is explained in detail through a third embodiment with reference to FIGS. 3A through 3S. First, as shown in FIG. 3A, a polyimide 10 on which an upper surface and a lower surface each has already been laminated a respective thin layer of copper 11, 111 is provided as a substrate in the present invention for the same purpose described above. Next, as shown in FIG. 3B, a plurality of layers of first dry films 13, 131 is each laminated on a top surface and a bottom surface of the polyimide substrate and the top portion is then exposed/developed to define a plurality of predetermined openings thereon. Then, in FIG. 3C, a plurality of an electro-coppering and an electronickelling operations are sequentially applied to form a multi-layer electroplated layer including a thick copper-electroplated layer 14 and a nickel-electroplated layer 15 from bottom to top inside the predetermined openings. Referring to FIG. 3D, a plurality of protrusions which comprise electroplated multi-layers are formed after the first dry film layers 13, 131 are removed. Thereafter, as shown in FIG. 3E, a plurality of layers of second dry films 16, 161 is each respectively laminated on an upper surface and a lower surface of the laminate and the lower portion is then exposed/developed to define a plurality of predetermined openings therein. Subsequently, as shown in FIG. 3F, the bottom thin copper layer 111 is removed and referring to FIG. 3G, a pattern of predetermined openings 112 is formed on the bottom thin copper layer 111 after the second dry film layers 16, 161 are removed. As shown in FIG. 3H, serving the bottom thin copper layer 111 with the above pattern as a mask, the bottom of the polyimide substrate 10 is etched by using a laser etching method, and by way of controlling the laser energy, the polyimide substrate 10 is etched to define a plurality of holes which do not totally penetrate the polyimide substrate 10 and provides contacts extending downwardly for subsequently electrolytic plating. As shown in FIG. 3I, a layer of a third dry film 19 is laminated on the upper surface of the laminate to protect the pattern previously formed. And then, the bottom thin copper layer 111 is removed, as shown in FIG. 3J. Thereafter, in FIG. 3K, the plurality of holes 12 has each applied thereto an electronickelling or an electro-coppering operation by electrolysis to form an external contact on a packaged circuit board, and the external contact is substantially an electrolytic contact 17 formed by filling the hole 12 with an electrolyte of nickel or copper and a distal end thereof is in a protruding form. Subsequently, as shown in FIG. 3L, the third dry film layer 19 is removed. Referring to FIG. 3M, a layer of protecting film 18 is applied on the lower surface of the laminate. As shown in FIG. 3N, a plurality of layers of fourth dry films 51, 511 is each respectively laminated on an upper surface and a lower surface of the laminate and the lower portion is subsequently exposed/developed to merely define a plurality of openings 512 in predetermined positions. As shown in FIG. 3O, a gold plating operation is applied to the aforementioned openings 512 to form a plurality of gold plated protruding contacts 20. Thereafter, as shown in FIG. 3P, after the fourth dry film layers 51, 511 and the protecting layer 18 are sequentially removed, the gold plated protruding contacts are exposed for providing a chip attachment. As shown in FIG. 3Q subsequently, the upper thin copper layer 11 exposed between the electroplated double-layer protrusions is removed. Finally, as shown in FIG. 3R, a chip installation hole 22 and a plurality of through holes 21 are respectively defined in a central position and other positions on two sides of the polyimide substrate 10 by applying a laser drilling operation thereto and then, a manufacturing process for packaging a printed circuit board is carried out. As to the method for installing a chip, as shown in FIG. 3S, a chip 40 is attached to the two gold plated protruding contacts 20 on the two protrusions where the chip is installed, by directly performing a single point bond operation.

As can be seen from the above description, there is provided an advantage of reducing cost since the polyimide, having been previously laminated a respective thin copper layer on each of the two sides, serves as a substrate in the present invention, thus the substrate cost is apparently cheaper than that in the aforesaid conventional way which requires an additional sputtering operation. In addition, there is provided another advantage of accurate positioning because the holes 12 are defined by applying a laser etching operation to the polyimide 10 and the electrolytic contacts 17 are further formed by applying an electrolytic plating operation, each contact is self-aligned in the corresponding hole 12 and thus, a misalignment or an excessive error will not be generated. Besides, the spacing between the contacts is controlled to come within a relative small range of 20 mil, which matches the requirement of fine contacts much more. Furthermore, the total dimension of the TAB-BGA packaged circuit board can be reduced since a single point bond technique is used for attaching a chip to the electroplated multi-layer (or double-layer) protrusions or gold plated protruding contacts beside a chip installation hole, as shown in FIGS. 1R, 2R or 3S, without needing a jumper wire connection.

While the present invention has been explained in relation to its preferred embodiments, it is to be understood that various modifications thereof will be apparent to those skilled in the art upon reading this specification. Therefore, it is to be understood that the invention disclosed herein is intended to cover all such modifications as fall within the scope of the appended claims.

I claim:

1. A method for packaging a TAB-BGA integrated circuit, comprising steps of:

providing a polyimide with a pre-laminated thin copper layer on each of two sides thereof as a substrate;

laminating, exposing and developing a plurality of first dry film layers on both surfaces of said polyimide substrate, while defining a plurality of predetermined openings in an upper surface of said polyimide substrate;

sequentially applying a multi-layer electroplating operation of electro-coppering, electronickelling, gold plating and electronickelling again on the exposed surface of the upper first dry film layer;

forming a plurality of electroplated multi-layer protrusions after removing said first dry film layers;

laminating, etching and developing a plurality of second dry film layers on two surfaces of a laminate, while defining predetermined openings on a lower surface of said laminate;

serving said second dry film layers as a mask for etching the bottom thin copper layer on a lower side of said laminate;

serving said bottom thin copper layer on the lower side as a mask for applying a laser etching operation to said polyimide substrate to form a pattern of holes without totally penetrating said polyimide substrate by the control of laser energy;

laminating a third dry film layer on the upper surface of the laminate for protecting the pattern previously formed;

applying an electrolytic plating operation to each hole in said polyimide substrate for forming electrolytic contacts by filling each hole with an electrolyte and the outer surface thereof being in a protruding form;

removing said third dry film layer;

etching the exposed top thin copper layer between said electroplated multi-layer protrusions to separate the adjacent electroplated layers from each other, and removing a nickel-electroplated layer on the top of the multi-layer electroplated layer by etching to expose a gold plated layer; and respectively defining a chip installation hole and a plurality of through holes in a central position and other predetermined positions on the two sides of the polyimide substrate by performing a laser drilling operation for defining a structure for mounting a chip between the two electroplated multi-layer protrusions beside the chip installation hole.

2. The method for packaging a TAB-EGA integrated circuit as claimed in claim 1, wherein a chip is attached to the structure for mounting the chip between the two electroplated multi-layer protrusions beside the chip installation hole by performing a single point bond operation.

3. The method for packaging a TAB-BGA integrated circuit as claimed in claim 1, wherein said electrolytic contacts are made of nickel.

4. The method for packaging a TAB-BGA integrated circuit as claimed in claim 1, wherein said electrolytic contacts are made of copper.

5. A method for packaging a TAB-BGA integrated circuit, comprising step of:

providing a polyimide with a pre-laminated thin copper layer on each of the two sides thereof as a substrate;

laminating, etching and developing a plurality of first dry film layers on both surfaces of said polyimide substrate, while defining a plurality of predetermined openings in an upper surface of said polyimide substrate;

sequentially applying a double-layer electroplating operation of electronickelling and gold plating on the exposed surface of the upper first dry film layer;

forming a plurality of electroplated double-layer protrusions after removing said first dry film layers;

laminating, etching and developing a plurality of second dry film layers on both surfaces of a laminate, while defining predetermined openings in a lower surface of said laminate;

serving said second dry film layers as a mask for etching the bottom thin copper layer on a lower side of said laminate;

serving said bottom thin copper layer on the lower side as a mask for applying a laser etching operation to said polyimide substrate to form a pattern of holes without totally penetrating said polyimide substrate by the control of laser energy;

laminating a third dry film layer on the upper surface of the laminate for protecting the pattern previously formed;

applying an electrolytic plating operation to each hole in said polyimide substrate for forming electrolytic contacts by filling each hole with an electrolyte and the outer surface thereof being in a protruding form;

removing said third dry film layer;

etching the exposed top thin copper layer between the electroplated double-layer protrusions to separate the adjacent electroplated layers from each other; and respectively defining a chip installation hole and a plurality of through holes in a central position and other predetermined positions in two sides of the polyimide substrate by performing a laser drilling operation for defining a structure of mounting a chip between the two electroplated double-layer protrusions beside the chip installation hole.

6. The method for packaging a TAB-BGA integrated circuit as claimed in claim 5, wherein a chip is attached to the structure for mounting the chip between the two electroplated double-layer protrusions beside the chip installation hole by performing a single point bond operation.

7. The method for packaging a TAB-BGA integrated circuit as claimed in claim 5, wherein said electrolytic contacts are made of nickel.

8. The method for packaging a TAB-BGA integrated circuit as claimed in claim 5, wherein said electrolytic contacts are made of copper.

9. A method for packaging a TAB-BGA integrated circuit, comprising steps of:

providing a polyimide with a pre-laminated thin copper layer on each of two sides thereof as a substrate;

laminating, etching and developing a plurality of first dry film layers on both surfaces of said polyimide substrate, while defining a plurality of predetermined openings in an upper surface of said polyimide substrate;

sequentially applying a double-layer electroplating operation of electro-coppering and electronickelling on the exposed surface of the upper first dry film layer;

forming a plurality of electroplated double-layer protrusions after removing said first dry film layers;

laminating, etching and developing a plurality of second dry film layers on both surfaces of a laminate, while defining a plurality of predetermined openings in a lower surface of said laminate;

serving said second dry film layers as a mask for etching the bottom thin copper layer on a lower side of said laminate;

serving said bottom thin copper layer on the lower side as a mask for applying a laser etching operation to said polyimide substrate to form a pattern of holes without totally penetrating said polyimide substrate by the control of laser energy;

laminating a third dry film layer on the upper surface of the laminate for protecting the pattern previously formed;

applying an electrolytic plating operation to each hole in said polyimide substrate for forming electrolytic contacts by filling each hole with an electrolyte and the outer surface thereof being in a protruding form;

removing said third dry film layer;

laminating, etching and developing a plurality of fourth dry film layers on both surfaces of the laminate, while defining a plurality of openings in the predetermined positions of the upper fourth dry film layer;

applying a gold plating operation to the predetermined openings for forming a plurality of gold plated protruding contacts;

etching the exposed top thin copper layer between the electroplated double-layer protrusions to separate the adjacent electroplated layers from each other; and defining a chip installation hole and a plurality of through holes respectively in a central position and other predetermined positions in two sides of the polyimide substrate by performing a laser drilling operation for defining a structure of mounting a chip between the two electroplated double-layer protrusions beside the chip installation hole.

10. The method for packaging a TAB-BGA integrated circuit as claimed in claim 9, wherein a chip is attached to the structure of mounting a chip between the two electroplated double-layer protrusions beside the chip installation hole by performing a single point bond operation.

11. The method for packaging a TAB-BGA integrated circuit as claimed in claim 9, wherein said electrolytic contacts are made of nickel.

12. The method for packaging a TAB-BGA integrated circuit as claimed in claim 9, wherein said electrolytic contacts are made of copper.

* * * * *